(12) United States Patent
Aronoff-Spencer et al.

(10) Patent No.: US 10,496,870 B2
(45) Date of Patent: Dec. 3, 2019

(54) ADJUSTABLE FINGERPRINT CAPTURING DEVICE

(71) Applicant: THE REGENTS OF THE UNIVERSITY OF CALIFORNIA, Oakland, CA (US)

(72) Inventors: Eliah Aronoff-Spencer, La Jolla, CA (US); Isaiah Freerksen, La Jolla, CA (US); Staal Vinterbo, La Jolla, CA (US); Yunting Zhao, La Jolla, CA (US); Tom Kalisky, Ramat Gan (IL)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 43 days.

(21) Appl. No.: 15/913,806

(22) Filed: Mar. 6, 2018

(65) Prior Publication Data

US 2018/0253588 A1     Sep. 6, 2018

Related U.S. Application Data

(60) Provisional application No. 62/467,669, filed on Mar. 6, 2017.

(51) Int. Cl.
*G06K 9/00* (2006.01)
*H01L 27/146* (2006.01)

(52) U.S. Cl.
CPC ..... *G06K 9/00087* (2013.01); *G06K 9/00013* (2013.01); *G06K 9/00046* (2013.01); *G06K 9/00919* (2013.01); *H01L 27/14678* (2013.01)

(58) Field of Classification Search
CPC .......... G06K 9/00087; G06K 9/00013; G06K 9/00046; G06K 9/00919
See application file for complete search history.

(56) References Cited

U.S. PATENT DOCUMENTS

| | | | |
|---|---|---|---|
| 2004/0101171 A1* | 5/2004 | Lane | G06K 9/00013 382/124 |
| 2010/0182126 A1* | 7/2010 | Martis | A61B 5/1172 340/5.83 |
| 2018/0068100 A1* | 3/2018 | Seo | G06F 21/32 |

* cited by examiner

*Primary Examiner* — David F Dunphy
(74) *Attorney, Agent, or Firm* — Sheppard, Mullin, Richter & Hampton LLP

(57) ABSTRACT

An adjustable fingerprint capturing device is configured to stabilize a finger of a subject. The adjustable fingerprint capturing device comprises an imaging device(s) configured to capture an image(s) of the finger. The adjustable fingerprint capturing device comprises a detection sensor(s) configured to detect presence of the finger. The adjustable fingerprint capturing device comprises a controller configured to activate the imaging device(s) based on input from the detection sensor(s). The adjustable fingerprint capturing device comprises a housing disposed to: the imaging device(s), the detection sensor(s), and the controller. The adjustable fingerprint capturing device comprises a finger stabilizer comprising at least one cantilever. The adjustable fingerprint capturing device comprises at least one cantilever spring connecting the housing and the at least one cantilever. The at least one cantilever spring is configured to create a space between the housing and the finger stabilizer. The space is large enough to accept the finger.

20 Claims, 11 Drawing Sheets

ADJUSTABLE FINGERPRINT CAPTURING DEVICE

CROSS-REFERENCE TO RELATED APPLICATIONS

This application claims priority to U.S. Provisional Patent Application No. 62/467,669 filed on Mar. 6, 2017 and titled "Adjustable Fingerprint Capturing Device," which is incorporated herein by reference in its entirety.

BACKGROUND

Many existing fingerprint capturing devices may not be configured to consistently capture fingerprints on some subjects, especially zero to three month old infants. Inconsistent fingerprint captures may lead to false identification of a subject. Direct pressure, applied by an operator of many existing fingerprint capturing devices on a finger of a subject, may cause compression of the finger on a platen. Compression of the finger during fingerprint capture may reduce the ability to identify fingerprint features. Employment of many existing fingerprint capturing devices may cause excessive torque (i.e. a rotational force) on the finger of the subject. Excessive torque on the finger during fingerprint capture may cause smudging on a platen. Smudging on a platen may reduce the ability to identify fingerprint features.

Many existing fingerprint capturing devices employing at least one light source and a platen may produce internal reflections. Captured images may be negatively affected by internal reflections. Many existing fingerprint capturing devices employing at least one light source and a platen may produce first surface reflections. First surface reflections, for the purpose of this disclosure, refers to reflections on the surface of the platen nearest an imaging device. Captured images may be negatively affected by first surface reflections. Effective identification of fingerprint features on infants may be challenging when employing fingerprint capturing devices configured to produce excessive internal reflections.

What is needed is an improved fingerprint capturing device.

DETAILED DESCRIPTION OF EMBODIMENTS

Embodiments are employed to capture fingerprint images. According to some of the various embodiments, an adjustable fingerprint capturing device may be configured to stabilize a finger of a subject. The subject may comprise an infant or a toddler. The adjustable fingerprint capturing device may comprise at least one imaging device. At least one of the at least one imaging device may comprise a camera, an ultrasound device, combinations thereof, and/or the like. The at least one imaging device may be configured to capture at least one image of the finger of the subject. The adjustable fingerprint capturing device may comprise at least one detection sensor. The at least one detection sensor may be configured to detect presence of the finger of the subject. The at least one detection sensor may be configured to detect a pressure of the finger and/or a proximity of the finger. The adjustable fingerprint capturing device may comprise a controller. The controller may be configured to activate the at least one imaging device. The controller may be configured to activate the at least one imaging device based on input from the at least one detection sensor. The adjustable fingerprint capturing device may comprise a housing. The housing may be disposed to the at least one imaging device, the at least one detection sensor, the controller, combinations thereof, and/or the like. The housing may comprise a finger guide. The finger guide may comprise at least one concaved surface configured to at least partially conform to the shape of the finger of the subject. The adjustable fingerprint capturing device may comprise a finger stabilizer. The finger stabilizer may comprise at least one cantilever. The adjustable fingerprint capturing device may comprise a cantilever spring. The cantilever spring may be connected to the housing and the at least one cantilever. The cantilever spring may be configured to create a space between the housing and the finger stabilizer. The space may be large enough to accept the finger of the subject.

According to some of the various embodiments, at least one imaging device may comprise an optical scanner. The at least one imaging device may be configured to capture images with a resolution in the range of 3,000 to 10,000 PPI. The at least one imaging device may be configured to capture multiple 2D images. The 2D images may be employed for rendering at least one 3D image. The at least one imaging device may be configured to communicate image data to a controller and/or remote device via a wired and/or wireless connection. At least one of the at least one imaging device may comprise at least one liquid lens.

Figure 1:
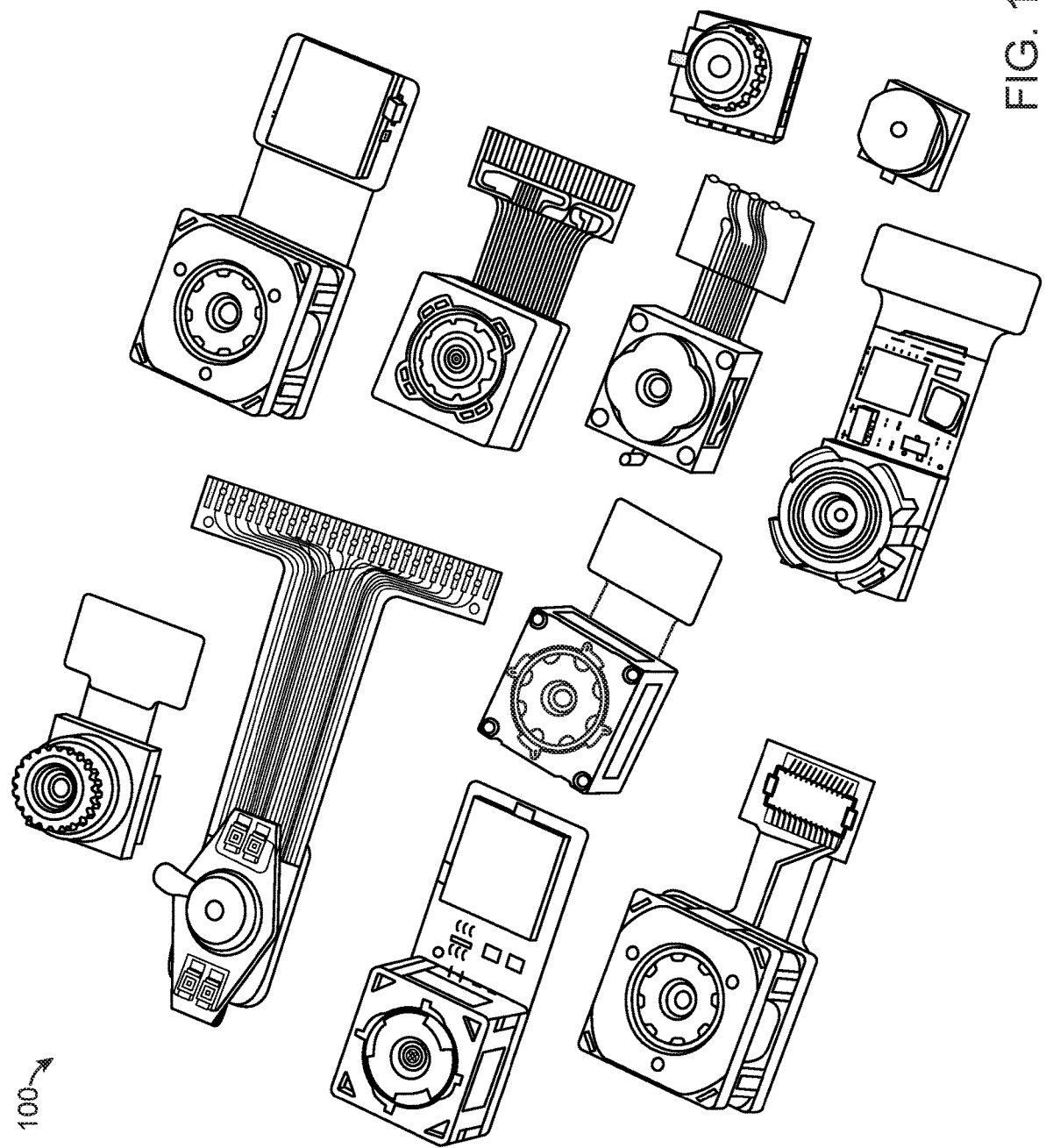
FIG. 1 illustrates example imaging devices according to various aspects of various embodiments.

FIG. 1 illustrates example imaging devices 100 according to various aspects of various embodiments. An imaging device may comprise a camera. Imaging devices 100 may be configured to communicate with a controller via wired and/or wireless connections. A wired connection may comprise a circuit board, a circuit board slot, a bus, combinations thereof, and/or the like.

Figure 2:
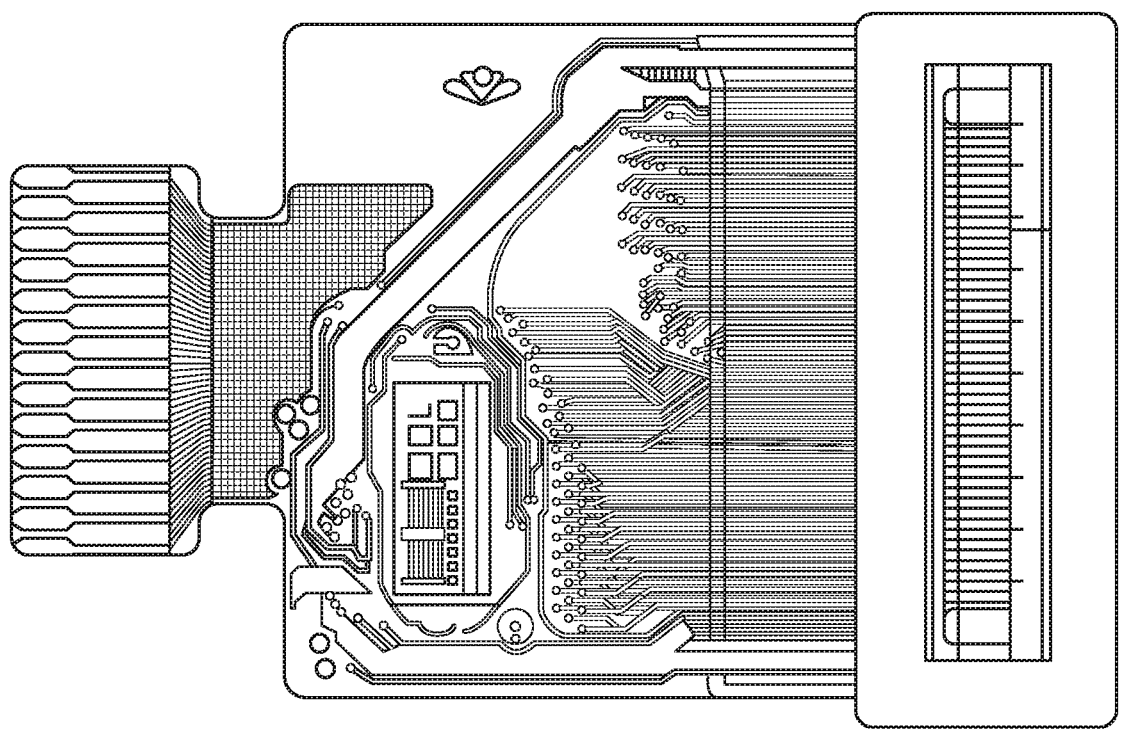
FIG. 2 illustrates an example imaging device as per an aspect of various embodiments.

FIG. 2 illustrates an example imaging device 200 as per an aspect of various embodiments. The imaging device 200 may comprise an ultrasound device.

Figure 3:
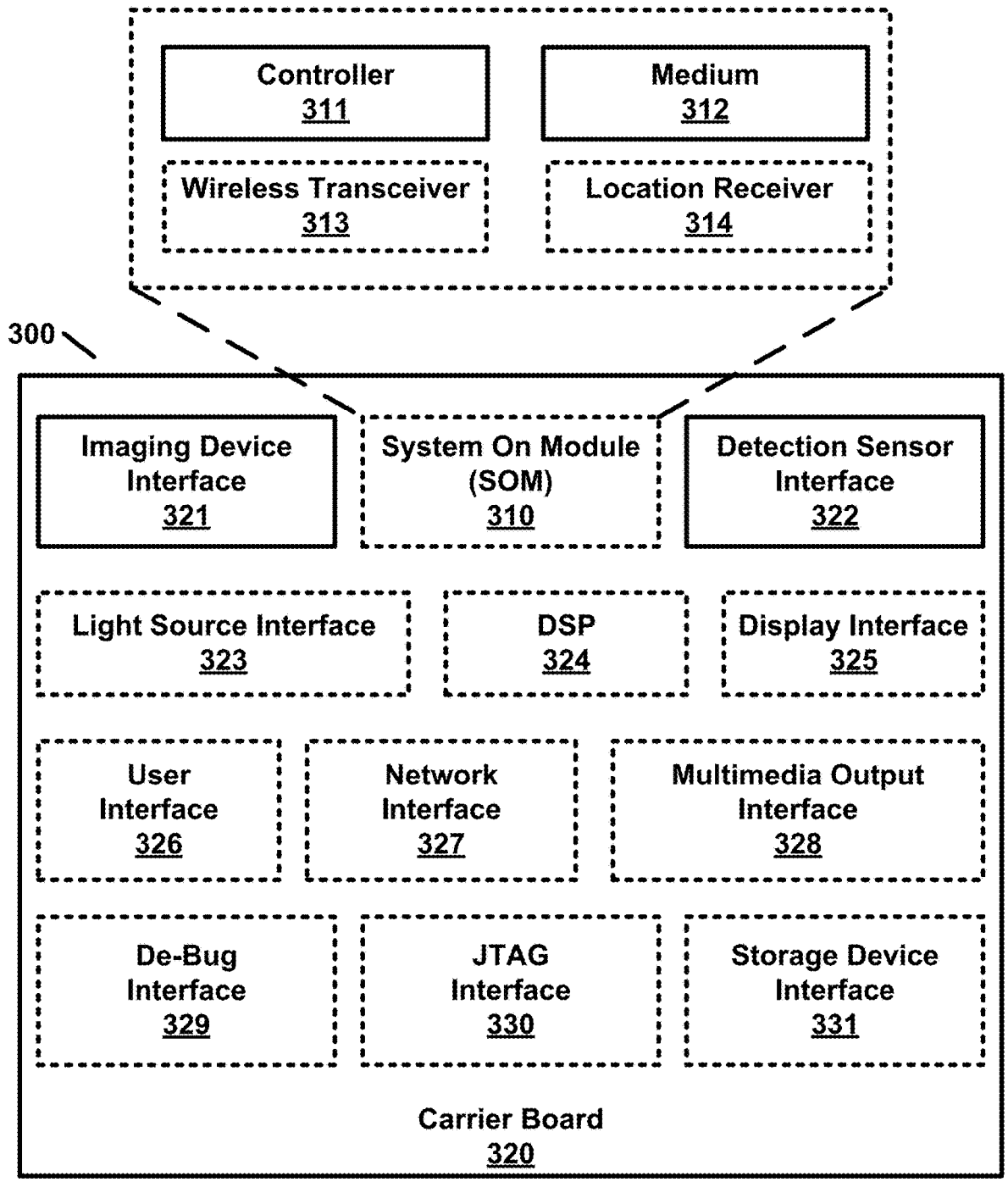
FIG. 3 is an example block diagram of a microprocessing environment in which aspects of embodiments of the present invention may be practiced.

FIG. 3 is an example block diagram of a microprocessing environment 300 in which aspects of embodiments of the present invention may be practiced. The microprocessing environment 300 may comprise a carrier board 320. The carrier board 320 may comprise a controller 311 and a computer readable medium 312. The controller 311 may comprise at least one processor. The controller 311 may comprise at least one power manager. Examples of computer readable medium 312 include Double Data Rate Synchronous Dynamic Random-Access Memory (DDR SDRAM), flash memory, at least one Solid State Drive (SSD), combinations thereof, and/or the like. An example of flash memory includes an embedded Multi-Media Controller (eMMC).

The microprocessing environment 300 may comprise a wireless transceiver 313. The wireless transceiver 313 may be configured to communicate with other components of the microprocessing environment 300 and/or at least one remote device. For example, the wireless transceiver 313 may be configured to communicate with at least one imaging device, at least one detection sensor, at least one light source, at least one display device, at least one storage device, combinations thereof, and or the like. Examples of remote devices include computers, laptops, tablets, smartphones, combinations thereof, and/or the like. The wireless transceiver 313 may be configured to communicate through employment of a Wireless Local Area Network (WLAN), a Bluetooth connection, a $4^{th}$ Generation Long Term Evolution (4G LTE) network, a Wi-Fi network, Frequency Modulation (FM) signals, combinations thereof, and/or the like. The microprocessing environment 300 may comprise a location receiver 314. An example of the location receiver 314 includes a Global Navigation Satellite System (GNSS) receiver. The microprocessing environment 300 may comprise a System On Module (SOM) 310. The SOM 310 may comprise the controller 311 and the medium 312. The SOM 310 may comprise the wireless transceiver 313. The SOM 310 may comprise the location receiver 314.

The carrier board 320 may comprise an imaging device interface 321. The imaging device interface 321 may be configured to communicate and/or interpret communication with at least one imaging device. The carrier board 320 may comprise a detection sensor interface 322. The detection sensor interface 322 may be configured to communicate and/or interpret communication with at least one detection sensor. The carrier board 320 may comprise a light source interface 323. The light source interface 323 may be configured to communicate and/or interpret communication with at least one light source. The carrier board 320 may comprise a Digital Signal Processor (DSP) 324. An example of the DSP 324 includes a Qualcomm Hexagon QDSP6. The carrier board 320 may comprise a display interface 325. The display interface 325 may be configured to communicate and/or interpret communication with at least one display device. The display device may be disposed to a housing disposed to the carrier board 320. The display interface 325 may comprise a Graphics Processing Unit (GPU).

The carrier board 320 may comprise a user interface 326. The user interface 326 may be configured to communicate with external devices. The user interface 326 may be configured to communicate through employment of a Universal Serial Bus (USB) connection, a FireWire connection, a Thunderbolt connection, combinations thereof, and/or the like. The carrier board 320 may comprise a network interface 327. The network interface 327 may be configured to communicate with external networks. The network interface 327 may be configured to communicate through employment of a Ethernet or Gigabit Ethernet connection. The carrier board 320 may comprise a multimedia output interface 328. The multimedia output interface 328 may be configured to communicate image information, video information, audio information, combinations thereof, and/or the like to external devices such as display devices, speakers, headphones, combinations thereof, and/or the like. The multimedia output interface may comprise an HDMI port, a Thunderbolt port, a DisplayPort, speaker ports, a headset port, combinations thereof, and/or the like.

The carrier board 320 may comprise a de-bug interface 329. The de-bug interface 329 may be employed to de-bug components of the microprocessing environment 300. The carrier board 320 may comprise a Joint Test Action Group (JTAG) interface 330. The JTAG interface 330 may be employed to de-bug components of the microprocessing environment 300. The carrier board 320 may comprise a storage device interface 331. The storage device interface 331 may be configured to communicate with external storage devices.

According to some of the various embodiments, a finger stabilizer may be configured to position a finger of a subject in a location suitable for a successful fingerprint capture. A cantilever spring may be configured to keep the finger stabilizer separated from a housing until pressure is applied to the finger stabilizer by an operator of an adjustable fingerprint capturing device. A fingerprint may be successfully captured through employment of at least one imaging device. The finger stabilizer may be configured to limit movement in the finger of the subject during application of pressure from an operator of an adjustable fingerprint capturing device. The finger stabilizer may comprise at least one contour configured for the top of the finger. The at least one contour may be configured for an infant and/or a toddler. The finger stabilizer may be replaced with a standard finger stabilizer. The standard finger stabilizer may comprise at least one contour configured for subjects older than 3 years.

According to some of the various embodiments, an adjustable fingerprint capturing device may comprise a platen. The platen may be disposed to a housing. The platen may comprise acrylic, glass, silicon, fiberglass, combinations thereof, and/or the like. A platen comprising silicone may be fabricated from moldable silicone. The platen may comprise at least one concaved surface configured to at least partially conform to the shape of a finger of a subject. The platen may comprise at least one waveguide. The platen may comprise at least one polarized surface. The platen may comprise a plurality of facets. At least one of the plurality of facets may be configured as a waveguide for at least one light source. At least one of the plurality of facets may be configured as a polarizer. The polarizer may be configured to polarize light emitted from at least one light source. The polarizer may be configured to polarize reflected light prior to being received in a lens of at least one imaging device. Each of at least one of the plurality of facets may be configured as a waveguide and a polarizer. The polarizer may be configured to polarize light in the same direction as a polarizer of reflected light expected to be received by a lens of at least one imaging device. At least one of the plurality of facets may be configured to diffuse light emitted from the at least one light source. A polarizer configured to polarize reflected light prior to being received in a lens of at least one imaging device may be distinct from the platen.

According to some of the various embodiments, an adjustable fingerprint capturing device may be configured to accept variable pressure applied by an operator. The adjustable fingerprint capture device may be configured to stabilize a finger of a subject. The adjustable fingerprint capture device may be configured to stabilize the top of the finger and/or the first joint of the finger of the subject. The adjustable fingerprint capture device may be configured to relax the finger of the subject. The adjustable fingerprint capture device may be configured to equalize pressure across at least a portion of the finger of the subject. The adjustable fingerprint capture device may be configured to remove torque from the finger of the subject. The adjustable fingerprint capture device may be configured to keep a required orientation of the finger of the subject during image capture of at least one image. The adjustable fingerprint capture device may be configured to balance a load of at least a portion of a palmar surface of the finger of the subject across a platen.

Figure 4:
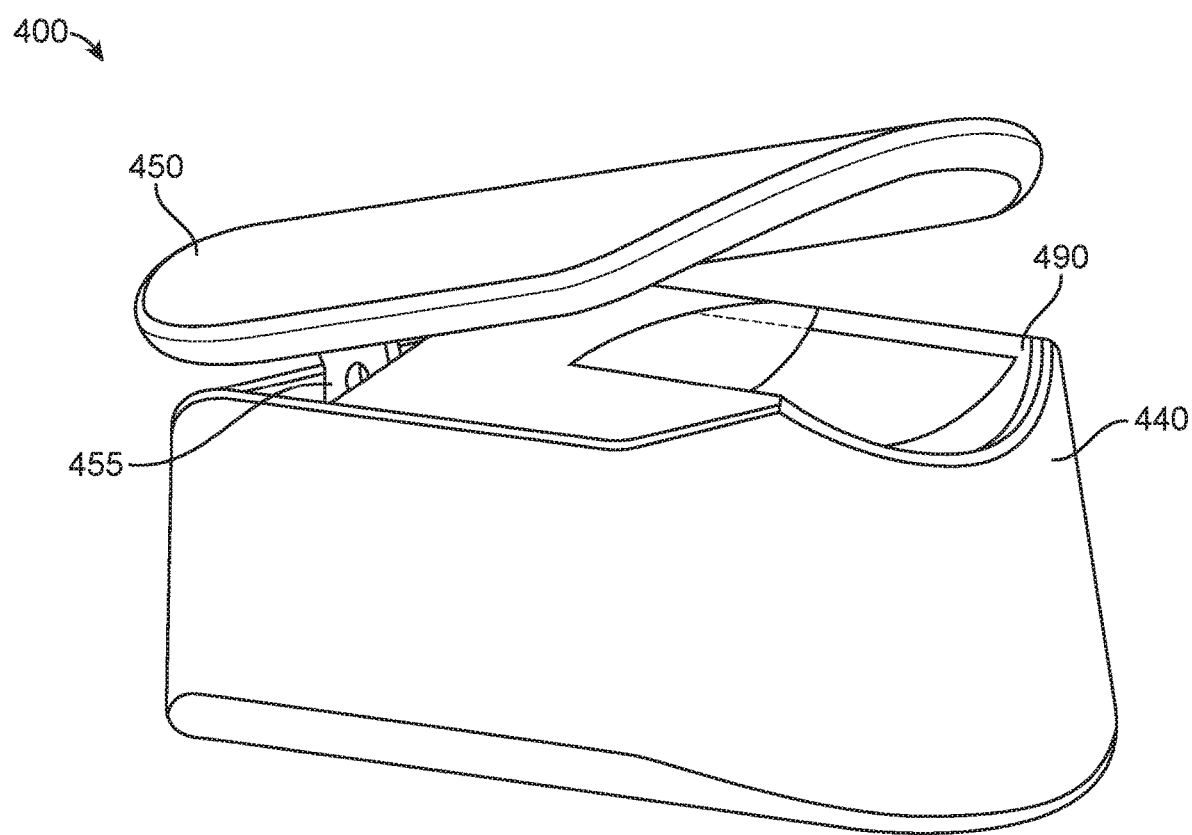
FIG. 4 illustrates an example adjustable fingerprint capturing device as per an aspect of an embodiment.

FIG. 4 illustrates an example adjustable fingerprint capturing device 400 as per an aspect of an embodiment. The adjustable fingerprint capturing device 400 may comprise a housing 440, a finger stabilizer 450, and at least one cantilever 455. The adjustable fingerprint capturing device 400 may comprise a finger guide 490. The finger guide 490 may comprise at least one concaved surface configured to at least partially conform to the shape of a finger of a subject.

According to some of the various embodiments, an adjustable fingerprint capturing device may comprise at least one light source. The at least one light source may be disposed to a housing. The at least one light source may be configured for structured light illumination. The at least one light source may comprise a LED. The at least one light source may comprise at least one LED array. At least one of the at least one light source may be configured to emit at least one light pulse. The adjustable fingerprint capturing device may be configured to capture a plurality of images. At least some of the plurality of images may be captured immediately following each of at least one light pulse from each of the at least one light source. A distinct diffuser may be employed to diffuse light from at least one of the at least one light source. A distinct polarizer may be employed to polarize light from at least one of the at least one light source. At least one of the at least one light source may be configured to emit red light, near infrared light, infrared light, combinations thereof, and/or the like. The adjustable fingerprint capturing device may comprise a detector. The detector may be configured to measure the red light, near infrared light, infrared light, combinations thereof, and/or the like. The adjustable fingerprint capturing device may be configured to measure oxygen saturation, deoxygenated hemoglobin, oxygenated hemoglobin, combinations thereof, and/or the like.

According to some of the various embodiments, an adjustable fingerprint capturing device may comprise at least one power source. The at least one power source may comprise a battery, a biofuel cell, a solar panel, combinations thereof, and/or the like. The adjustable fingerprint capturing device may comprise a charging receiver. The charging receiver may be configured to receive power and transfer at least part of the power to at least one power source. The charging receiver may be configured to receive power through employment of a wired connection. The charging receiver may be configured to receive power wirelessly. The charging receiver may comprise at least one induction coil.

According to some of the various embodiments, an adjustable fingerprint capturing device may comprise at least one transceiver. The at least one transceiver may be configured to communicate with a controller, at least one imaging device, at least one computing device, at least one remote device, combinations thereof, and/or the like. The at least one transceiver may be configured to communicate through employment of a Bluetooth connection, Wi-Fi network, a cellular network, combinations thereof, and/or the like. The adjustable fingerprint capturing device may comprise at least one modem. The at least one modem may be configured to communicate with a controller, at least one imaging device, at least one computing device, at least one remote device, combinations thereof, and/or the like. The at least one modem may be configured to communicate through employment of an Ethernet connection, a serial connection (for example USB, Thunderbolt, SATA, SCSI), combinations thereof, and/or the like. The adjustable fingerprint capturing device may comprise at least one audio and/or video interface. The at least one audio and/or video interface may comprise an HDMI interface, a DisplayPort interface, a DVI interface, combinations thereof, and/or the like.

According to some of the various embodiments, an adjustable fingerprint capturing device may comprise at least one filter. At least one of the at least one filter may be disposed to at least one imaging device. At least one of the at least one filter may be disposed to at least one light source. The adjustable fingerprint capturing device may comprise at least one polarizer. At least one of the at least one polarizer may be disposed to at least one of the at least one imaging device. At least one of the at least one polarizer may be disposed to at least one of the at least one light source. The at least one polarizer disposed to the at least one imaging device may be parallel to the at least one polarizer disposed to the at least one light source. The at least one polarizer disposed to the at least one imaging device may be configured to polarize reflected light parallel to the polarized light emitted from the at least one light source through at least one polarized surface of a platen.

Figure 5:
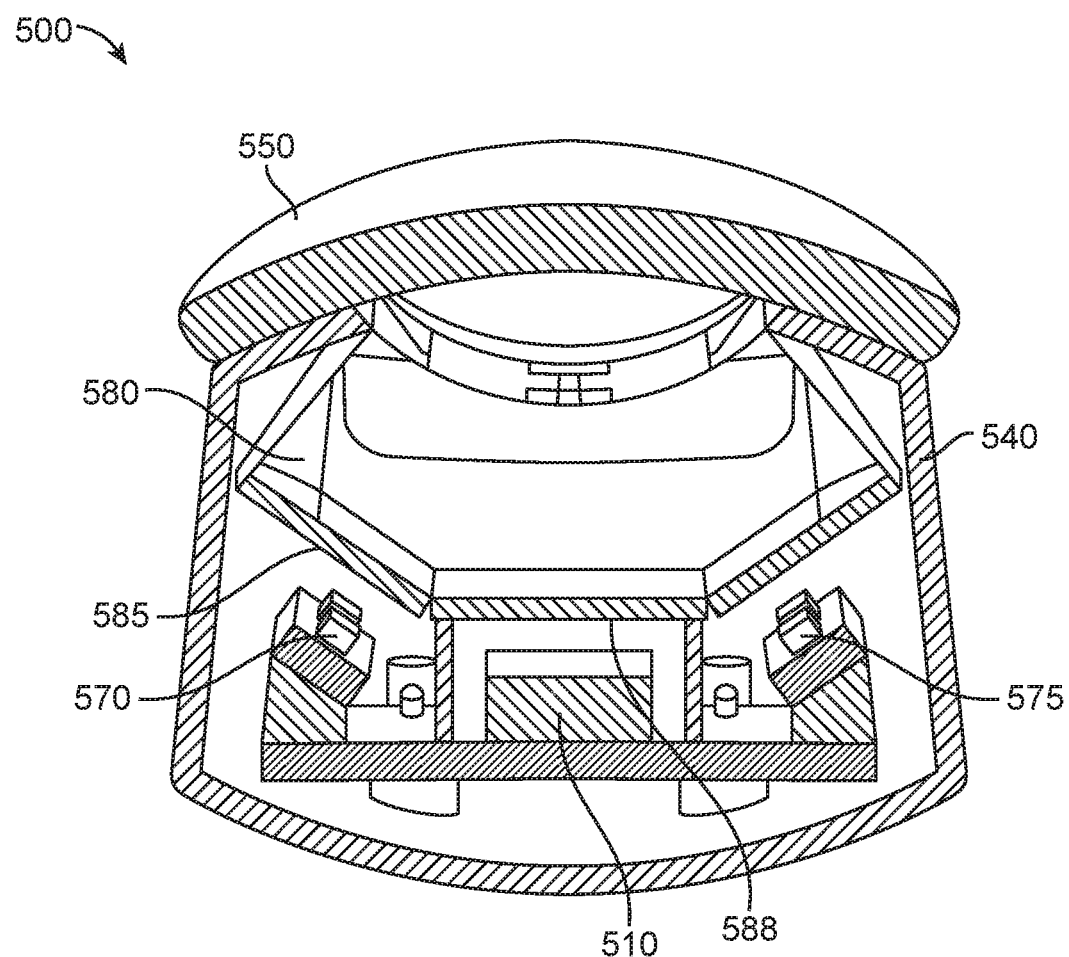
FIG. 5 illustrates an example adjustable fingerprint capturing device as per an aspect of an embodiment.

FIG. 5 illustrates an example adjustable fingerprint capturing device 500 as per an aspect of an embodiment. The adjustable fingerprint capturing device 500 may comprise at least one imaging device (e.g. 510), a housing 540, and a finger stabilizer 550. The adjustable fingerprint capturing device 500 may comprise at least one light source (e.g. 570, 575). The adjustable fingerprint capturing device 500 may comprise a platen 580. The platen 580 may comprise multifaceted platen. The platen 580 may comprise at least one concaved surface configured to at least partially conform to the shape of a finger of a subject. The platen 580 may comprise at least one waveguide (e.g. 585). The platen 580 may comprise at least one polarized surface (e.g. 588).

Figure 6:
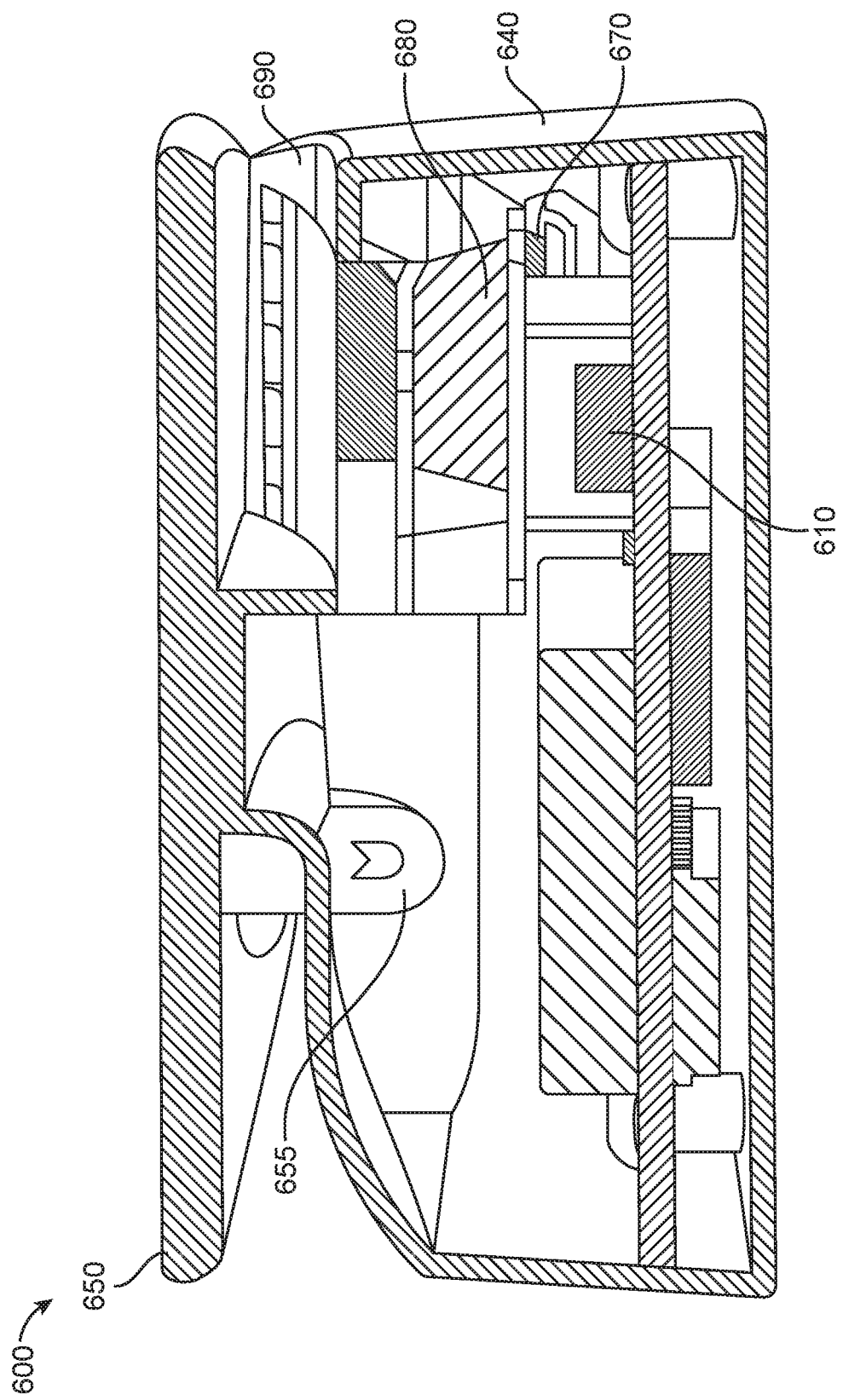
FIG. 6 illustrates an example adjustable fingerprint capturing device as per an aspect of an embodiment.

FIG. 6 illustrates an example adjustable fingerprint capturing device 600 as per an aspect of an embodiment. The adjustable fingerprint capturing device 600 may comprise a housing 640, a finger stabilizer 650, and at least one cantilever 655. The adjustable fingerprint capturing device 600 may comprise a finger guide 690. The finger guide 690 may comprise at least one concaved surface configured to at least partially conform to the shape of a finger of a subject. The adjustable fingerprint capturing device 600 may comprise at least one imaging device (e.g. 610). The adjustable fingerprint capturing device 600 may comprise at least one light source (e.g. 670). The adjustable fingerprint capturing device 600 may comprise a platen 680. The platen 680 may comprise a multi-faceted platen.

Figure 7:
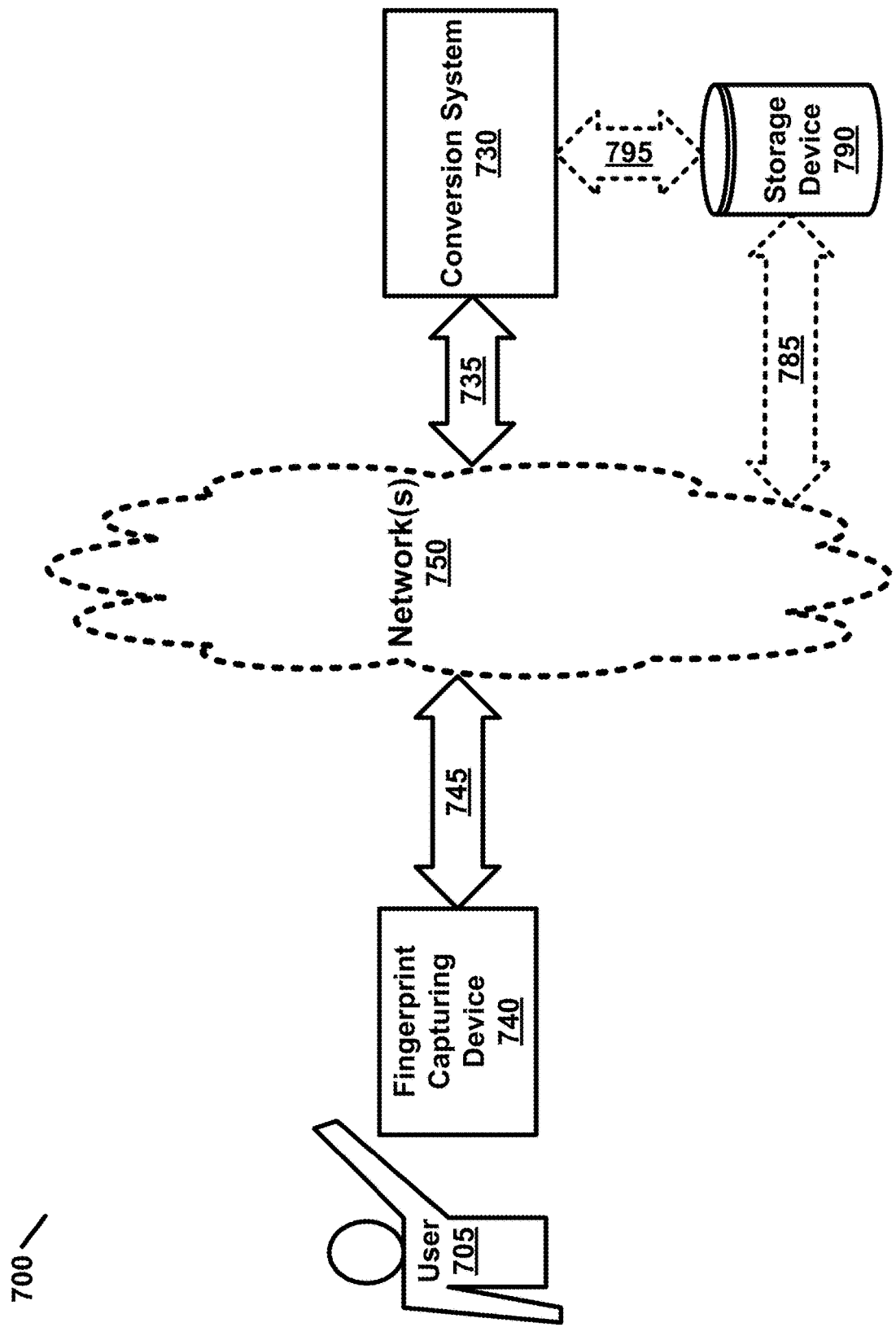
FIG. 7 is an example block diagram showing a fingerprint capturing device system according to various aspects of various embodiments.

FIG. 7 is an example block diagram showing a fingerprint capturing device system 700 according to various aspects of various embodiments. The fingerprint capturing device system 700 may comprise a fingerprint capturing device 740 and a conversion system 730. The fingerprint capturing device 740 may be configured for operation by user 705. The conversion system 730 may be configured to convert at least one fingerprint into at least one fingerprint feature map. The fingerprint capturing device 740 may be configured to communicate with the conversion system 730. At least one network (e.g. 750) may be employed for communication between the fingerprint capturing device 740 and the conversion system 730. Network connection 745 may be employed for communication between the fingerprint capturing device 740 and one of the at least one network (e.g. 750). Network connection 735 may be employed for communication between the conversion system 730 and one of the at least one network (e.g. 750). The network connection 745 and the network connection 735 may be the same. For example, fingerprint capturing device 740 may be configured to communicate directly with the conversion system 730. The fingerprint capturing device system 700 may comprise a storage device 790. The conversion system 730 may be configured to communicate with the storage device 790 through employment of connection 795. The fingerprint capturing device 740 may be configured to communicate with the storage device 790 through employment of network connection 785. The network connection 745 and the network connection 785 may be the same. For example, fingerprint capturing device 740 may be configured to communicate directly with the storage device 790.

According to some of the various embodiments, a method of capturing at least one image of a finger of a subject may comprise placing the finger of the subject in between a housing and a finger stabilizer. The method may comprise detecting presence of the finger through employment of at least one detection sensor. The method may comprise capturing at least one fingerprint of the subject through employment of at least one imaging device. The method may comprise converting at least one of the at least one fingerprint into at least one fingerprint feature map. The method may comprise creating a biometric indexed health record comprising data related to at least one medical treatment administered to the subject. The method may comprise storing data associated with at least one of the at least one fingerprint. The data may be accessible to the biometric indexed health record. The data may be accessible to a health record.

Figure 8:
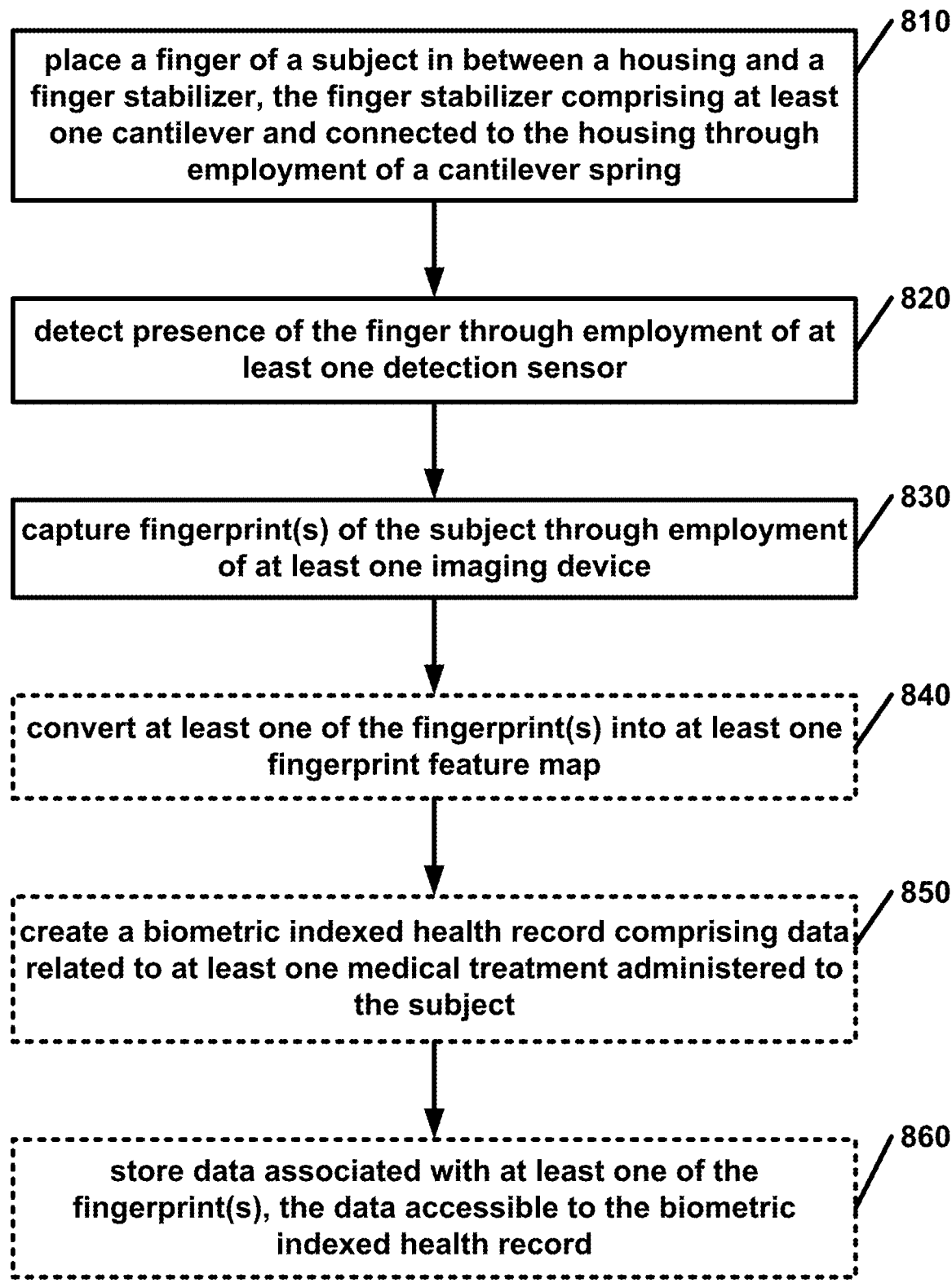
FIG. 8 is an example flow diagram of capturing at least one fingerprint according to various aspects of various embodiments.

FIG. 8 is an example flow diagram of capturing at least one fingerprint according to various aspects of various embodiments. A finger of a subject may be placed in between a housing and a finger stabilizer at 810. The finger stabilizer may comprise at least one cantilever. The finger stabilizer may be connected to the housing through employment of at least one cantilever spring. Presence of the finger may be detected through employment of at least one detection sensor at 820. At least one fingerprint of the subject may be captured through employment of at least one imaging device at 830. At least one of the at least one fingerprint may be converted into at least one fingerprint feature map at 840. A biometric indexed health record may be created at 850. The biometric indexed health record may comprise data related to at least one medical treatment administered to the subject. Data associated with at least one of the at least one fingerprint may be stored at 860. The data may be accessible to the biometric indexed health record.

According to some of the various embodiments, a multi-faceted platen may be configured to at least partially support a finger of a subject. The multi-faceted platen may comprise a finger facet. The finger facet may be configured to receive the finger of the subject. The finger facet may be concave in relation to the finger of the subject. The multi-faceted platen may comprise a first light source facet. The first light source facet may be configured to receive light from at least one first light source. The first light source facet may be configured to direct at least a portion of the light received from the at least one first light source to the finger of the subject. The multi-faceted platen may comprise a second light source facet configured to receive light from at least one second light source. The second light source facet may be configured to direct at least a portion of the light received from the at least one second light source to the finger of the subject. The multi-faceted platen may comprise an imaging facet. The imaging facet may be configured to receive reflected light from the finger of the subject. The imaging facet may be configured to pass the reflected light to at least one imaging device. A first angle between the first light source facet and the imaging facet may be greater than 90 degrees. A second angle between the second light source facet and the imaging facet may be greater than 90 degrees. The imaging facet may be substantially parallel to the longitudinal axis of the finger facet.

According to some of the various embodiments, a first light source facet may comprise a waveguide. The first light source facet may comprise a polarized surface. The first light source facet may comprise a diffused surface. The angle between the first light source facet and an imaging facet may be greater than 90 degrees. A second light source facet may comprise a waveguide. The second light source facet may comprise a polarized surface. The second light source facet may comprise a diffused surface. The angle between the second light source facet and the imaging facet may be greater than 90 degrees. The imaging facet may comprise a polarized surface. The polarized surface of the imaging facet may be parallel to the polarized surface of the first light source facet. The polarized surface of the imaging facet may be parallel to the polarized surface of the second light source facet. The polarized surface of the imaging facet may be configured to polarize reflected light parallel to the light emitted through the first light source facet and/or the second light source facet.

Figure 9:
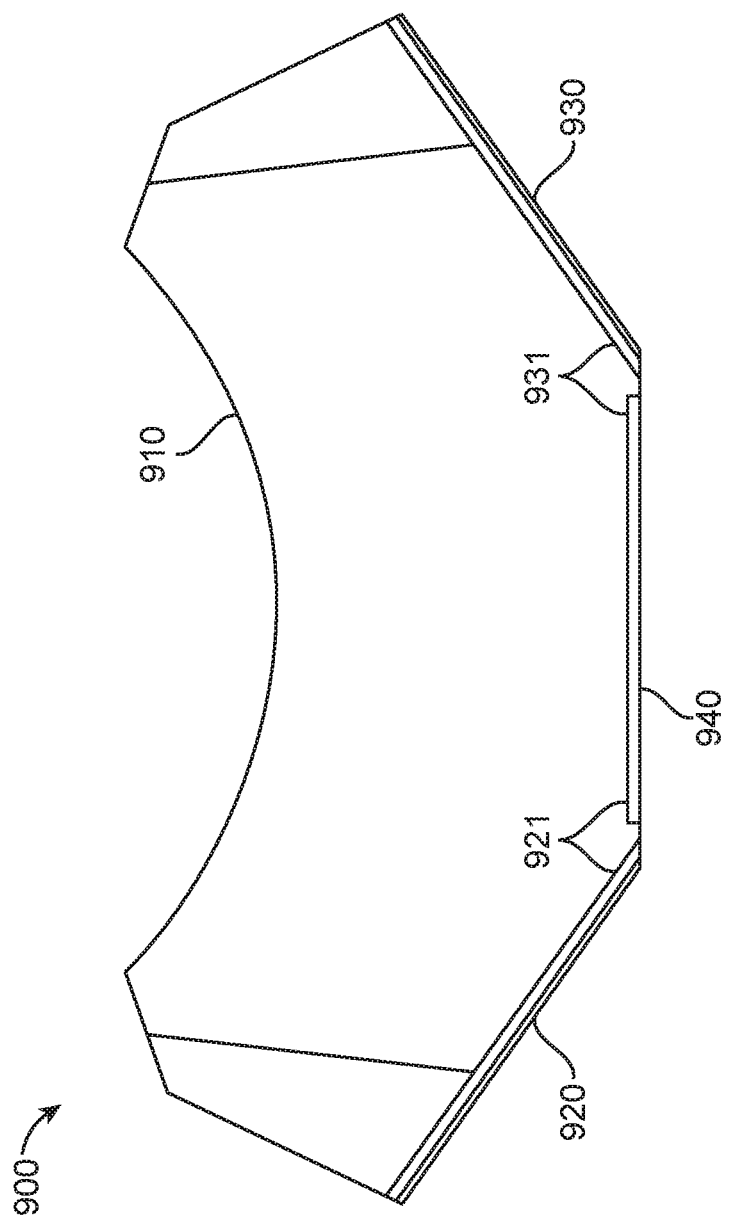
FIG. 9 illustrates an example multi-faceted platen as per an aspect of an embodiment.

FIG. 9 illustrates an example multi-faceted platen 900 as per an aspect of an embodiment. The multi-faceted platen 900 may comprise a finger facet 910, a first light source facet 920, a second light source facet 930, and an imaging facet 940. The finger facet 910 may be concave. A first angle 921 between the first light source facet 920 and the imaging facet 940 may be greater than 90 degrees. A second angle 931 between the second light source facet 930 and the imaging facet 940 may be greater than 90 degrees.

Figure 10:
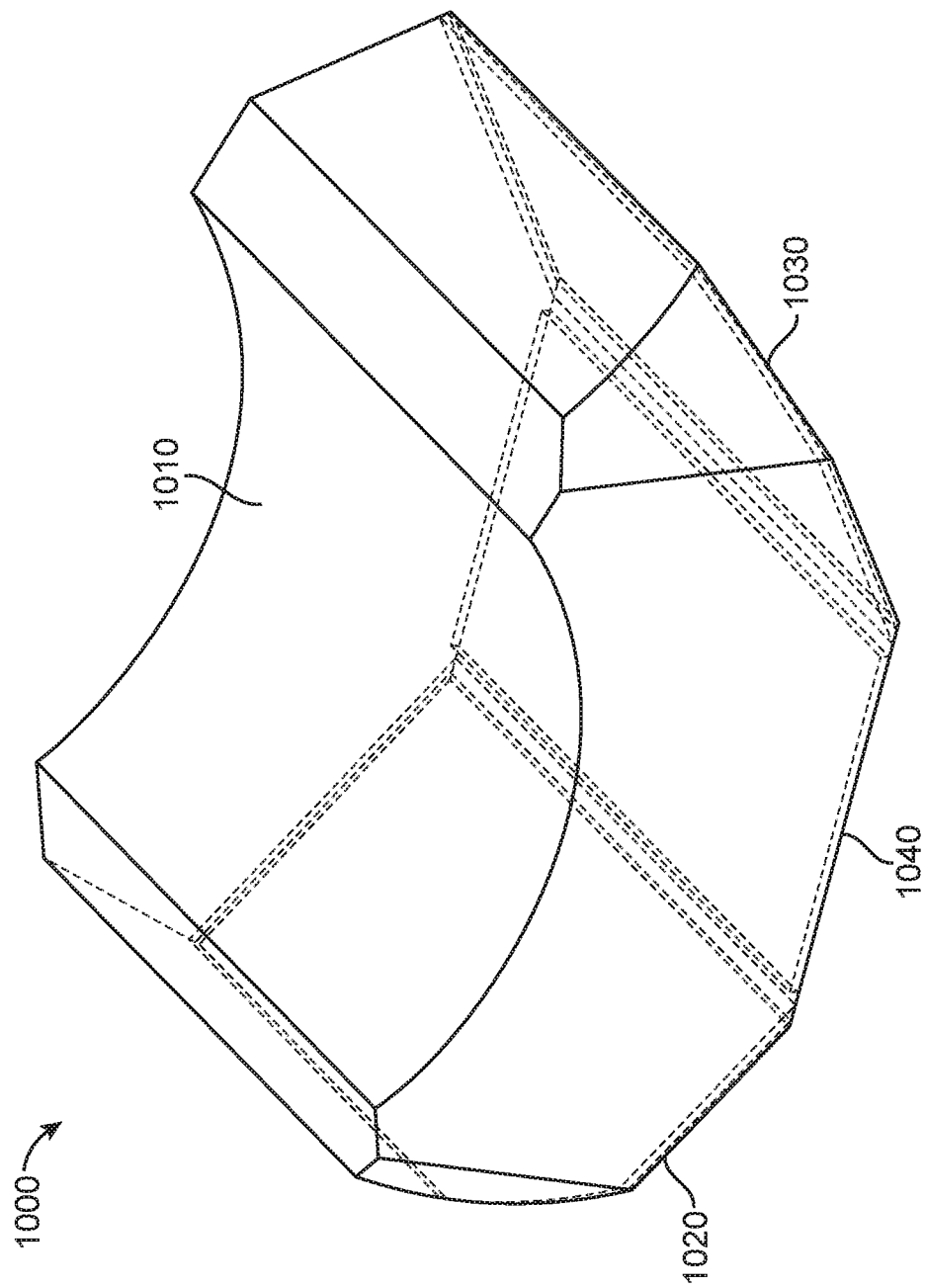
FIG. 10 illustrates an example multi-faceted platen as per an aspect of an embodiment.

FIG. 10 illustrates an example multi-faceted platen 1000 as per an aspect of an embodiment. The multi-faceted platen 1000 may comprise a finger facet 1010, a first light source facet 1020, a second light source facet 1030, and an imaging facet 1040. The finger facet 1010 may be concave. The first light source facet 1020 may comprise a diffused and polarized surface. The second light source facet 1030 may comprise a diffused and polarized surface. The imaging facet 1040 may comprise a polarized surface.

Figure 11:
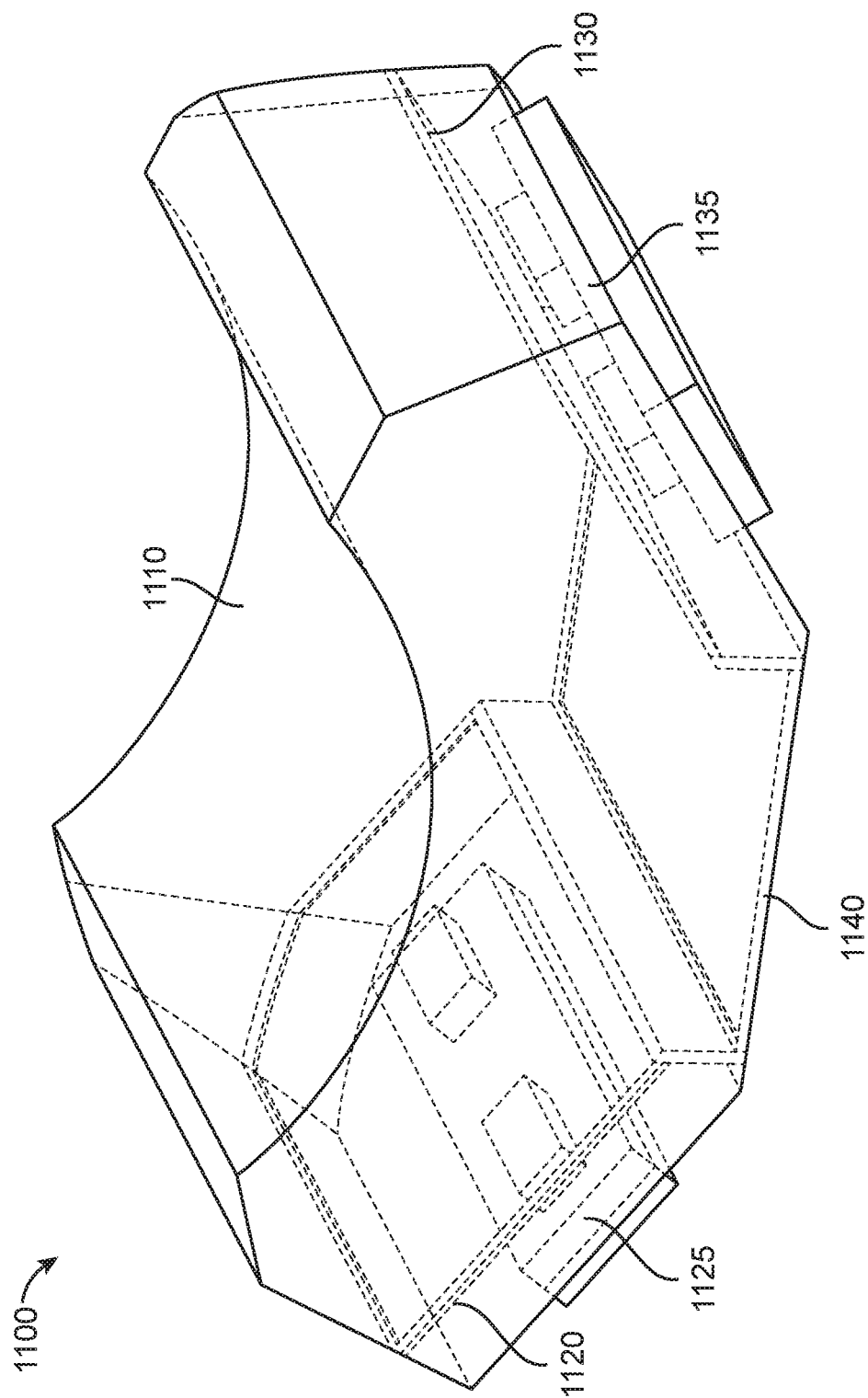
FIG. 11 illustrates an example multi-faceted platen as per an aspect of an embodiment.

FIG. 11 illustrates an example multi-faceted platen 1100 as per an aspect of an embodiment. The multi-faceted platen 1100 may comprise a finger facet 1110, a first light source facet 1120, a second light source facet 1130, and an imaging facet 1140. The finger facet 1110 may be concave. The first light source facet 1120 may comprise a diffused and polarized surface. The second light source facet 1130 may comprise a diffused and polarized surface. The imaging facet 1140 may comprise a polarized surface. The polarization of the first light source facet 1120 may be parallel to the polarization of the imaging facet 1140. The polarization of the second light source facet 1130 may be parallel to the polarization of the imaging facet 1140. The multi-faceted platen 1100 may comprise a first light source 1125 and a second light source 1135. The first light source 1125 and the second light source 1135 may be embedded in the multi-faceted platen 1100. The first light source facet 1120 may be configured to receive light from the first light source 1125 orthogonally to the surface of the first light source facet 1120. The second light source facet 1130 may be configured to receive light from the second light source 1135 orthogonally to the surface of the second light source facet 1130.

According to some of the various embodiments, a fingerprint capturing device may comprise at least one imaging device. The at least one imaging device may be configured to capture at least one image of a finger of a subject. The fingerprint capturing device may comprise at least one first light source. The at least one first light source may be configured to propagate light to the finger of the subject. The fingerprint capturing device may comprise at least one second light source. The at least one second light source may be configured to propagate light to the finger of the subject. The fingerprint capturing device may comprise a multi-faceted platen. The multi-faceted platen may comprise a finger facet. The finger facet may be configured to receive the finger of the subject. The multi-faceted platen may comprise a first light source facet. The first light source facet may be configured to receive light from the at least one first light source. The light from the at least one first light source may be received orthogonally to the surface of the first light source facet. The multi-faceted platen may comprise a second light source facet. The second light source facet may be configured to receive light from the at least one second light source. The light from the at least one second light source may be received orthogonally to the surface of the second light source facet. The multi-faceted platen may comprise an imaging facet. The imaging facet may be configured to receive reflected light from the finger of the subject. The imaging facet may be configured to pass the reflected light to the at least one imaging device. The fingerprint capturing device may comprise at least one filter. The at least one filter may be disposed to the at least one imaging device. The fingerprint capturing device may comprise at least one polarizer. The at least one polarizer may be disposed to the at least one imaging device. The at least one polarizer may be parallel to at least one polarizer disposed to the at least one first light source and/or the at least one second light source.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In this specification, "a" and "an" and similar phrases are to be interpreted as "at least one" and "one or more." References to "a", "an", and "one" are not to be interpreted as "only one". References to "an" embodiment in this disclosure are not necessarily to the same embodiment.

Some of the elements described in the disclosed embodiments may be implemented as modules. A module is defined here as an isolatable element that performs a defined function and has a defined interface to other elements. The modules described in this disclosure may be implemented in hardware, a combination of hardware and software, firmware, wetware (i.e. hardware with a biological element) or a combination thereof, all of which are behaviorally equivalent. For example, modules may be implemented using computer hardware in combination with software routine(s) written in a computer language (Java, HTML, XML, PHP, Python, ActionScript, JavaScript, Ruby, Prolog, SQL, VBScript, Visual Basic, Perl, C, C++, Objective-C or the like). Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs), field programmable gate arrays (FPGAs), and complex programmable logic devices (CPLDs). Computers, microcontrollers and microprocessors may be programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies may be used in combination to achieve the result of a functional module.

Some embodiments may employ processing hardware. Processing hardware may include one or more processors, computer equipment, embedded system, machines and/or the like. The processing hardware may be configured to execute instructions.

The instructions may be stored on a machine-readable medium. According to some embodiments, the machine-readable medium (e.g. automated data medium) may be a medium configured to store data in a machine-readable format that may be accessed by an automated sensing device. Examples of machine-readable media include: magnetic disks, cards, tapes, and drums, flash memory, memory cards, electrically erasable programmable read-only memory (EEPROM), solid state drives, optical disks, barcodes, magnetic ink characters, and/or the like.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments.

In addition, it should be understood that any figures that highlight any functionality and/or advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112. Claims that do not expressly include the phrase "means for" or "step for" are not to be interpreted under 35 U.S.C. 112.

What is claimed is:

1. An adjustable fingerprint capturing device configured to stabilize a finger of a subject, the adjustable fingerprint capturing device comprising:
   a. at least one imaging device configured to capture at least one image of the finger of the subject;
   b. at least one detection sensor configured to detect presence of the finger of the subject;

c. a controller configured to activate the at least one imaging device based on input from the at least one detection sensor;
d. a housing disposed to:
   i. the at least one imaging device;
   ii. the at least one detection sensor; and
   iii. the controller;
e. a finger stabilizer comprising at least one cantilever; and
f. at least one cantilever spring connected to the housing and the at least one cantilever, the at least one cantilever spring configured to create a space between the housing and the finger stabilizer, the space large enough to accept the finger of the subject.

2. The adjustable fingerprint capturing device according to claim 1, wherein the subject comprises one of:
   a. an infant; and
   b. a toddler.

3. The adjustable fingerprint capturing device according to claim 1, wherein at least one of the at least one imaging device comprises at least one of:
   a. a camera; and
   b. an ultrasound device.

4. The adjustable fingerprint capturing device according to claim 1, wherein at least one of the at least one imaging device comprises at least one liquid lens.

5. The adjustable fingerprint capturing device according to claim 1, wherein the at least one detection sensor is configured to detect at least one of the following:
   a. a pressure of the finger; and
   b. a proximity of the finger.

6. The adjustable fingerprint capturing device according to claim 1, wherein the housing comprises a finger guide comprising at least one concaved surface configured to at least partially conform to the shape of the finger of the subject.

7. The adjustable fingerprint capturing device according to claim 1, wherein the finger stabilizer is configured to position the finger of the subject in a location suitable for a successful fingerprint capture through employment of at least one of the at least one imaging device.

8. The adjustable fingerprint capturing device according to claim 1, wherein the finger stabilizer is configured to limit movement in the finger of the subject during application of pressure from an operator of the adjustable fingerprint capturing device.

9. The adjustable fingerprint capturing device according to claim 1, further comprising a platen disposed to the housing.

10. The adjustable fingerprint capturing device according to claim 1, further comprising a platen disposed to the housing, the platen comprising at least one concaved surface configured to at least partially conform to the shape of the finger of the subject.

11. The adjustable fingerprint capturing device according to claim 1, further comprising a platen disposed to the housing, the platen comprising at least one waveguide.

12. The adjustable fingerprint capturing device according to claim 1, further comprising at least one light source disposed to the housing.

13. The adjustable fingerprint capturing device according to claim 1, further comprising at least one wireless transceiver configured to communicate with at least one of the following:
   a. the controller;
   b. at least one of the at least one imaging device;
   c. at least one computing device; and
   d. at least one remote device.

14. The adjustable fingerprint capturing device according to claim 1, further comprising at least one filter disposed to at least one of the at least one imaging device.

15. A method of capturing at least one image of a finger of a subject, the method comprising:
   a. placing the finger of the subject in between a housing and a finger stabilizer, the finger stabilizer comprising at least one cantilever and connected to the housing through employment of at least one cantilever spring;
   b. detecting presence of the finger through employment of at least one detection sensor; and
   c. capturing at least one fingerprint of the subject through employment of at least one imaging device.

16. The method according to claim 15, further comprising converting at least one of the at least one fingerprint into at least one fingerprint feature map.

17. The method according to claim 15, further comprising:
   a. creating a biometric indexed health record comprising data related to at least one medical treatment administered to the subject; and
   b. storing data associated with at least one of the at least one fingerprint, the data accessible to the biometric indexed health record.

18. The method according to claim 15, further comprising storing data associated with at least one of the at least one fingerprint, the data accessible to a biometric indexed health record.

19. The method according to claim 15, further comprising storing data associated with at least one of the at least one fingerprint, the data accessible to a health record.

20. A fingerprint capturing device comprising:
   a. at least one imaging device configured to capture at least one image of a finger of a subject;
   b. at least one first light source configured to propagate light to the finger of the subject;
   c. at least one second light source configured to propagate light to the finger of the subject; and
   d. a multi-faceted platen comprising:
      i. a finger facet configured to receive the finger of the subject, wherein the finger facet is concave in relation to the finger of the subject;
      ii. a first light source facet configured to receive first light from the at least one first light source, the first light received orthogonally to the surface of the first light source facet;
      iii. a second light source facet configured to receive second light from the at least one second light source, the second light received orthogonally to the surface of the second light source facet, wherein at least one of the first and second light source facets comprises a waveguide; and
      iv. an imaging facet configured to receive reflected light from the finger of the subject and pass the reflected light to the at least one imaging device.

* * * * *